(12) United States Patent
Park et al.

(10) Patent No.: US 9,484,395 B2
(45) Date of Patent: Nov. 1, 2016

(54) METHOD OF MANUFACTURING ORGANIC LIGHT EMITTING DISPLAY PANEL

(71) Applicant: LG DISPLAY CO., LTD., Seoul (KR)

(72) Inventors: JoongKeun Park, Goyang-si (KR); YoungHak Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/081,472

(22) Filed: Mar. 25, 2016

(65) Prior Publication Data

US 2016/0218163 A1 Jul. 28, 2016

Related U.S. Application Data

(62) Division of application No. 14/582,849, filed on Dec. 24, 2014, now Pat. No. 9,331,101.

(30) Foreign Application Priority Data

Sep. 4, 2014 (KR) ........................ 10-2014-0117415

(51) Int. Cl.
*H01L 27/32* (2006.01)
(52) U.S. Cl.
CPC ....... *H01L 27/3265* (2013.01); *H01L 27/3262* (2013.01); *H01L 27/3272* (2013.01); *H01L 27/3276* (2013.01); *H01L 2227/323* (2013.01)
(58) Field of Classification Search
CPC .................................................. H01L 17/1255
USPC .................................................... 438/23, 239
See application file for complete search history.

(56) References Cited

U.S. PATENT DOCUMENTS

| 2005/0179374 | A1 | 8/2005 | Kwak |
| 2008/0233665 | A1 | 9/2008 | Jung et al. |
| 2011/0024754 | A1* | 2/2011 | Yamazaki ......... G02F 1/136204 |
| | | | 257/59 |

FOREIGN PATENT DOCUMENTS

| JP | 2005-227788 A | 8/2005 |
| KR | 10-2014-0064310 A1 | 5/2001 |
| KR | 10-2014-0079093 A | 6/2014 |

* cited by examiner

*Primary Examiner* — Dung Le
(74) *Attorney, Agent, or Firm* — Birch, Stewart, Kolasch & Birch, LLP

(57) ABSTRACT

The present invention relates to a method of manufacturing an organic light emitting display panel. The method includes forming a light shielding layer on a substrate, forming a first oxide semiconductor and a second oxide semiconductor on the light shielding layer, and forming a gate insulating layer and a gate overlapping a portion of the first oxide semiconductor and a whole of the second oxide semiconductor. The method further includes performing an etching so that the portion of the first oxide semiconductor has conductivity, forming a first contact hole in the light shielding layer and forming a second contact hole in the first oxide semiconductor, forming a driving power line connected to the light shielding layer through the first contact hole, and forming source/drain electrodes connected to the first oxide semiconductor through the second contact hole.

15 Claims, 16 Drawing Sheets

METHOD OF MANUFACTURING ORGANIC LIGHT EMITTING DISPLAY PANEL

CROSS-REFERENCE TO RELATED APPLICATION

This application is a Divisional Application of U.S. application Ser. No. 14/582,849 filed on Dec. 24, 2014, now U.S. Pat. No. 9,331,101, which claims priority from and the benefit under 35 U.S.C. §119(a) of Korean Patent Application No. 10-2014-0117415, filed on Sep. 4, 2014, which is hereby incorporated by reference for all purposes as if fully set forth herein.

BACKGROUND OF THE INVENTION

1. Field of the Invention

The present invention relates to an organic light emitting display panel and a method of manufacturing the same.

2. Description of the Background Art

As the information society develops, display devices for displaying an image are being increasingly required in various forms, and in recent years, various display devices such as Liquid Crystal Displays (LCDs), Plasma Display Panels (PDPs), and Organic Light Emitting Display Devices (OLEDs) have been utilized. Such a display device includes a display panel corresponding to the display device.

A display panel includes thin film transistors in each pixel area, and a specific pixel area in the display panel is controlled through a flow of an electric current of the thin film transistor. For this, the thin film transistor includes a storage capacitor. The storage capacitor in the thin film transistor forms an electric field between materials having a difference between two specific potentials. The larger the size of a capacitor is, the larger the capacitance is, but this may reduce an opening ratio of a pixel area. Therefore, a technique for maintaining or increasing the capacitance of the capacitor while increasing the opening ratio is necessary.

SUMMARY OF THE INVENTION

An aspect of the present invention is to provide an organic light emitting display panel and a method of manufacturing the same, which can maintain or increase a capacitance while reducing the size of a capacitor by arranging the capacitors in parallel.

In accordance with an aspect of the present invention, a display panel includes a light shielding layer electrically connected to a driving power line on a substrate, and storage capacitors formed on an oxide semiconductor in parallel, insulated from the oxide semiconductor, and overlapped on a gate.

In accordance with another aspect of the present invention, a method of manufacturing a display panel includes forming a light shielding layer on a substrate, forming an oxide semiconductor layer, a gate and source/drain electrodes overlapping one another in a storage capacitor area, and forming storage capacitors in parallel by connecting the light shielding layer with a driving power line.

As described above, according to one or more embodiments of the present invention, storage capacitors are provided in parallel, therefore a capacitance of the storage capacitor can be maintained and the area of the storage capacitor can be reduced.

According to one or more embodiments of the present invention, two storage capacitors are formed in parallel using source/drain electrodes, and thus the area of a capacitor can be reduced.

According to one or more embodiments of the present invention, the area of the capacitor is reduced and a non-emissive area in a pixel area is reduced, thereby increasing an opening ratio.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1:
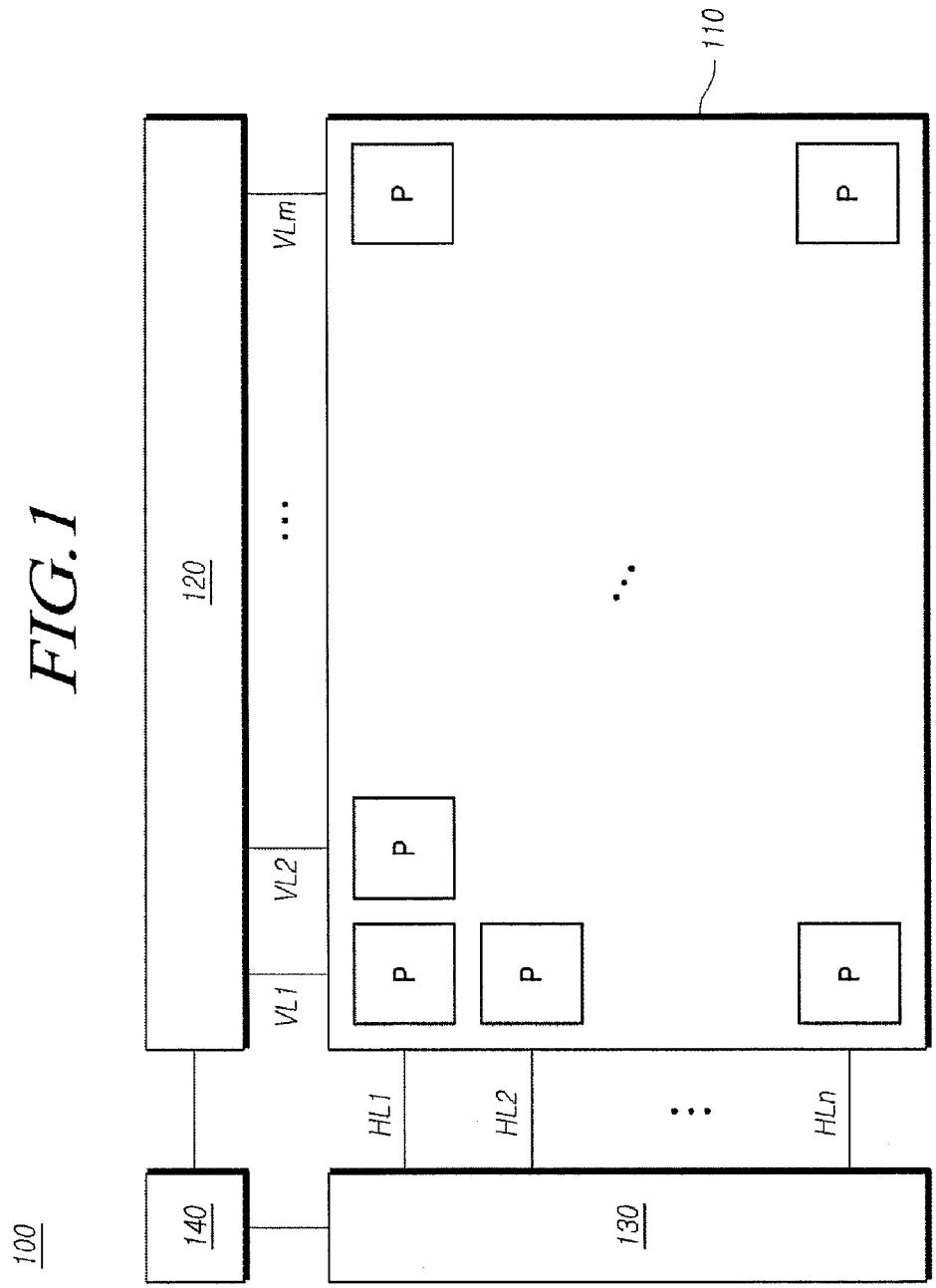
FIG. 1 is a schematic view illustrating a display device according to embodiments of the present invention.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a schematic view illustrating a display device according to embodiments of the present invention.

Referring to FIG. 1, the display device 100 according to the embodiments of the present invention includes a display panel 110 in which a plurality of first lines VL1 to VLm are formed in a first direction (for example, a vertical direction) and a plurality of second lines HL1 to HLn are formed in a second direction (for example, a horizontal direction), a first driving unit 120 for supplying a first signal to the plurality of first lines VL1 to VLm, a second driving unit 130 for supplying a second signal to the plurality of second lines HL1 to HLn, and a timing controller 140 for controlling the first driving unit 120 and the second driving unit 130.

A plurality of pixels P are defined in the display panel 110 as the plurality of first lines VL1 to VLm formed in the first direction (for example, the vertical direction) and the plurality of second lines HL1 to HLn formed in the second direction (for example, the horizontal direction) cross each other.

Each of the above-mentioned first driving unit 120 and the second driving unit 130 may include at least one driving Integrated Circuit (IC) outputting a signal for an image display.

The plurality of first lines VL1 to VLm formed in the display panel 100 in the first direction may be, for example, data lines formed in the vertical direction (first direction), for transferring a data voltage (first signal) to vertical rows of pixels, and the first driving unit 120 may be a data driving unit for supplying the data voltage to the data lines.

The plurality of second lines HL1 to HLn formed in the display panel 110 in the second direction may be gate lines formed in the horizontal direction (second direction), for transferring a scan signal (first signal) to horizontal rows of pixels, and the second driving unit 130 may be a gate driving unit for supplying the scan signal to the gate lines.

In addition, the display panel 110 includes a pad unit so as to connect with the first driving unit 120 and the second driving unit 130. When the first driving unit 120 provides the first signal to the plurality of first lines VL1 to VLm, the pad unit transfers the first signal to the display panel 110. In the same manner, when the second driving unit 130 provides the second signal to the plurality of second lines HL1 to HLn, the pad unit transfers the second signal to the display panel 110. Therefore, in a process of forming an area of pixels in the display panel 110, the pad unit is also formed.

In each pixel area, at least one thin film transistor is formed. The thin film transistor includes source/drain electrodes, a semiconductor layer (i.e., an active layer) and a gate. When an oxide semiconductor is used as the active layer, the thin film transistor is referred to as an oxide Thin Film Transistor (TFT). The oxide material used as the active layer may be an IGZO, but it is not limited thereto. The oxide TFT may be applied to a display device including a liquid crystal display device and an organic light emitting display device. As an embodiment, the oxide semiconductor may be any of a Zinc Oxide (ZnO) semiconductor, an Indium Zinc Oxide (IZO) semiconductor, an Indium Aluminum Zinc Oxide (IAZO) semiconductor, an Indium Gallum Zinc Oxide (IGZO) semiconductor and an Indium Tin Zinc Oxide (ITZO) semiconductor, but it is not limited thereto. The oxide TFT may be applied to a display device including a liquid crystal display device and an organic light emitting display device.

Meanwhile, in the oxide TFT, in a coplanar structure in which the gate and the source/drain electrodes are on the active layer, when the source/drain electrodes are etched, a channel layer of the oxide semiconductor is not damaged, thereby securing superior element characteristics.

Figure 2A:
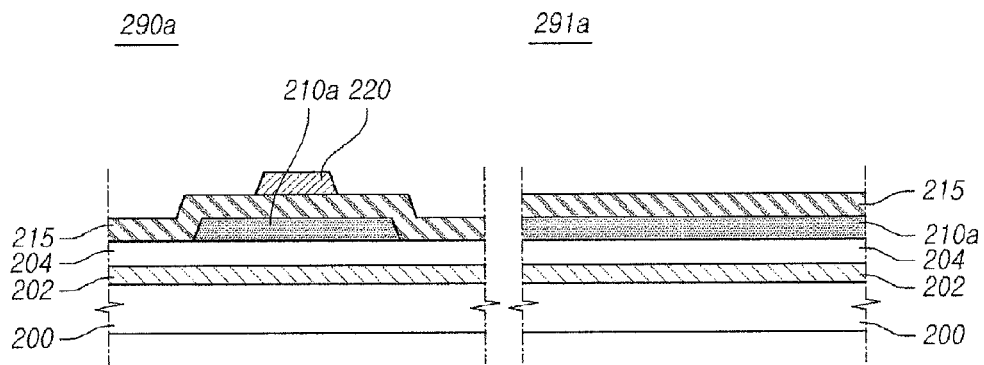
FIG. 2A is a view illustrating a process of forming an oxide semiconductor according to an embodiment of the present invention.

FIG. 2A is a view illustrating a process of forming an oxide semiconductor. A reference numeral 290a shows a TFT area, a reference numeral 291 a shows a storage capacitor (Cst) area. A light shielding layer 202 is formed on a substrate 200, and a buffer layer 204 is selectively formed on the light shielding layer 202. The light shielding layer 202 is a metal layer protecting an active layer which is an oxide semiconductor layer from an external light.

In addition, an active layer 210a is formed. A gate insulating layer 215 is formed on the active layer 210a, and in a TFT process 290a, a gate 220 is formed on the gate insulating layer 215.

Figure 2B:
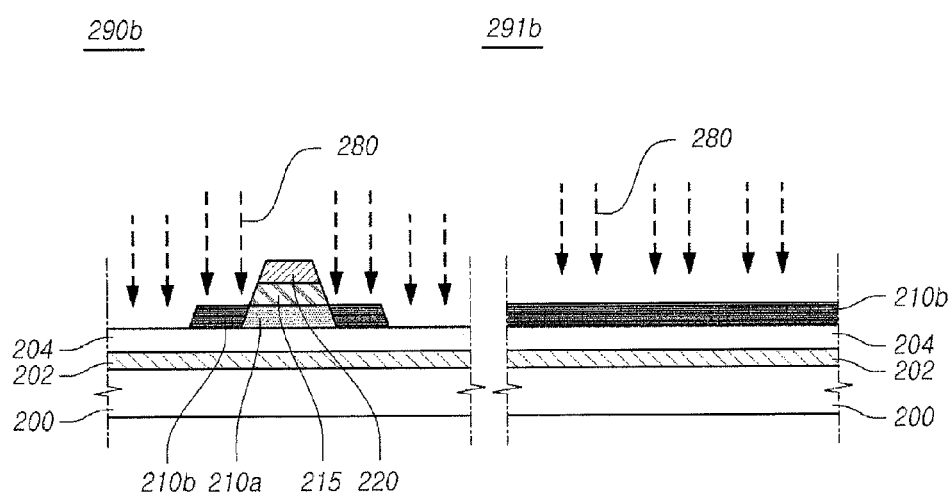
FIG. 2B is a view which shows that a gate insulating layer is etched so that an active layer has conductivity in FIG. 2A according to an embodiment of the present invention.

FIG. 2B is a view which shows that the gate insulating layer is etched so that the active layer has conductivity in FIG. 2A.

When an etching (for example, a dry etching) is performed as shown in a reference numeral 280, an active layer 210b which is not covered by the gate in a TFT area 290b has conductivity, and an active layer 210a which is coverted by the gate does not have conductivity. Meanwhile, the active layer 210b of a storage capacitor area 291b has conductivity.

A storage capacitor formed in the process described with reference to FIGS. 2A and 2B uses an active layer which is an oxide semiconductor layer and a metal layer used as source/drain, as electrodes. An InterLayer Dielectric (ILD) between the active layer and the source/drain electrodes is used as an insulator. As described with reference to the reference numerals 291a and 291b, the active layer which is not protected by the gate has conductivity due to a plasma generated by the etching, and thus the active layer is operated as the capacitor together with the source/drain electrodes. Meanwhile, when a gate layer is used as the electrode of the capacitor, a margin between the gate layer and an adjacent gate layer should be considered, therefore the size of the capacitor can not be increased and it is difficult to increase a capacitance. The light shielding layer is connected to a source of a driving transistor, thereby preventing a voltage change of the driving transistor by the light shielding layer.

Figure 3A:
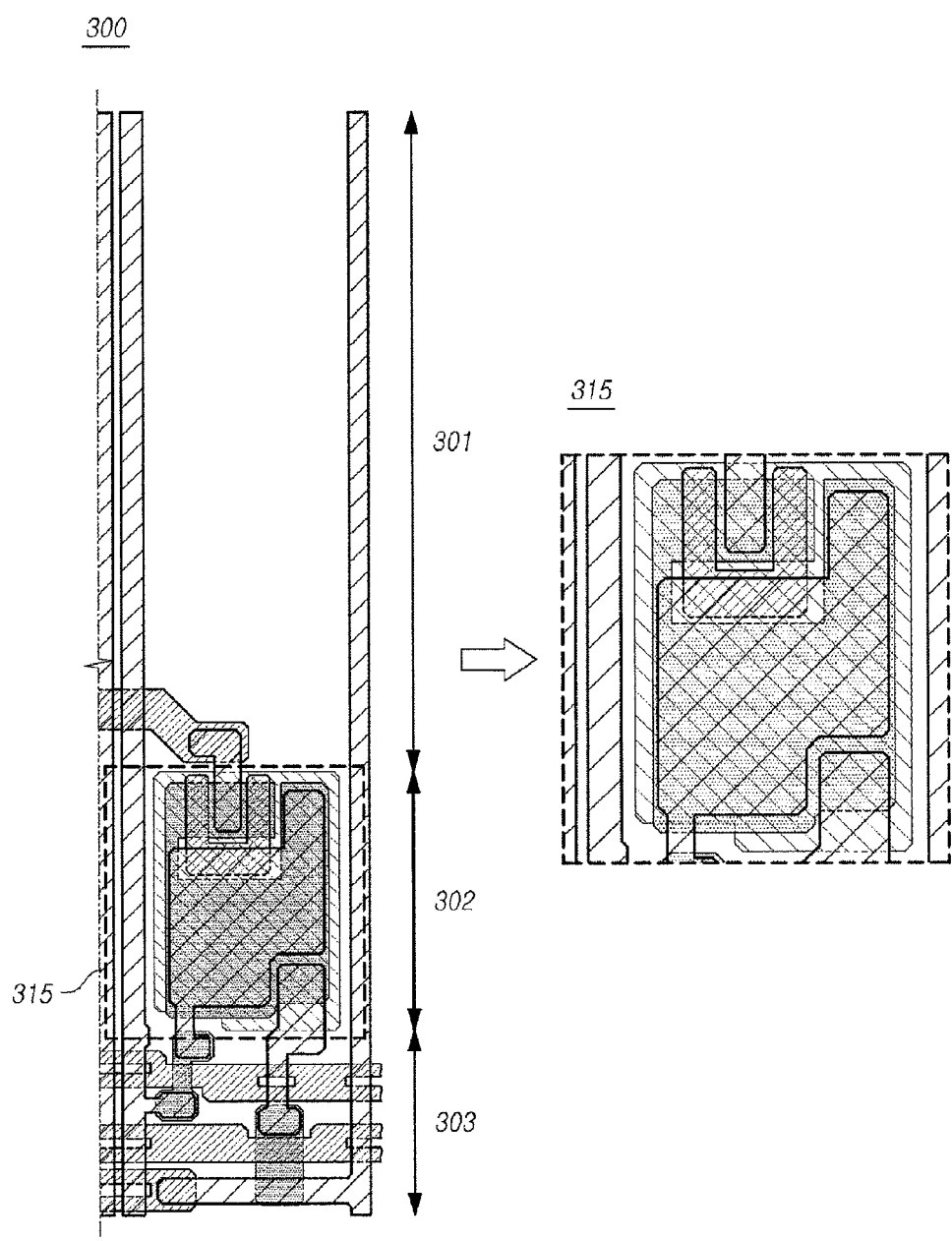
FIG. 3A is a view illustrating a structure of a storage capacitor formed through a process of FIGS. 2A and 2B according to an embodiment of the present invention.

FIG. 3A is a view illustrating a structure of the storage capacitor formed through the process of FIGS. 2A and 2B. In FIG. 3A, a pixel area 300 including one TFT and a light emitting area includes a light emitting area 301, a capacitor and transistor area 302 and a line area 303. The capacitor and transistor area 302 occupies about 25% of a whole pixel area 300. In order to have enough capacitance, an area of the capacitor should be increased or a thickness of an interlayer dielectric should be reduced, but since the thickness of the interlayer dielectric is fixed by a process condition, so that the thickness of the interlayer dielectric can not be reduced. Therefore, in order to increase the capacitance, the area of the capacitor should be increased, and in this case, since the area of the capacitor is increased in the fixed pixel area, an opening ratio of a whole pixel is reduced.

Figure 3B:
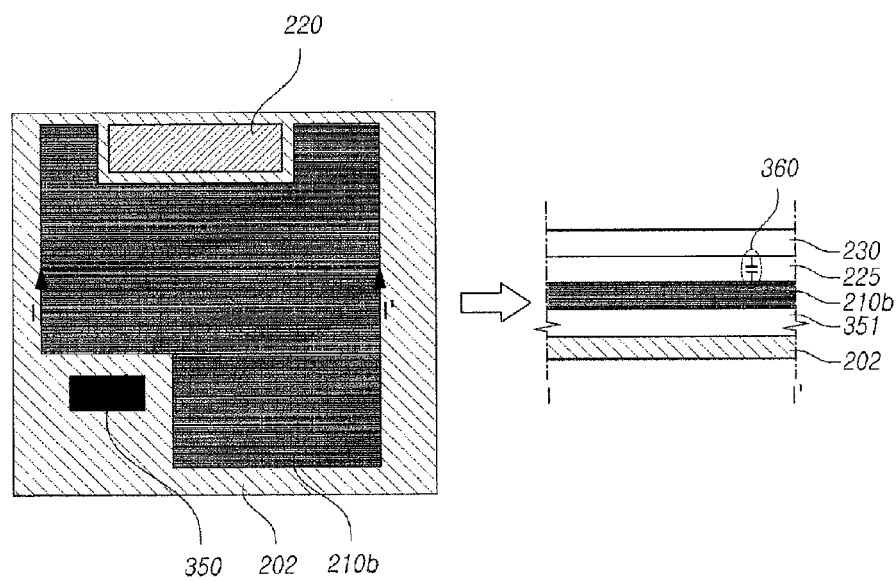
FIG. 3B is a view illustrating a forming of a capacitor in a reference numeral 315 of FIG. 3A according to an embodiment of the present invention.

FIG. 3B is a view illustrating a forming of a capacitor in a reference numeral 315 of FIG. 3A. A buffer layer 351 is formed on a light shielding layer 202, and the active layer 210b having conductivity is formed on the buffer layer 351 to play a role of the electrode of the capacitor. In addition, an interlayer dielectric 225 and source/drain electrodes 230 are formed. The light shielding layer 202 is connected to the source/drain electrodes through a contact hole 350 to prevent a voltage change of a driving transistor as described above. In addition, a storage capacitor 360 is formed between the active layer 210b having conductivity and the source/drain electrodes 230.

In a panel of a coplanar structure, a storage capacitor uses the active layer and the source/drain electrodes as the electrodes as shown in FIG. 3B. The capacitor of such a structure should increase the size thereof in order to maintain a capacitance, this causes a reduction of an opening ratio. Hereinafter, in the present invention, a structure in which an area of a capacitor is reduced and an opening ratio is increased by forming a light shielding layer connected to an ELVDD under an active layer in a storage capacitor area and forming the capacitors in parallel, is described.

Figure 4:
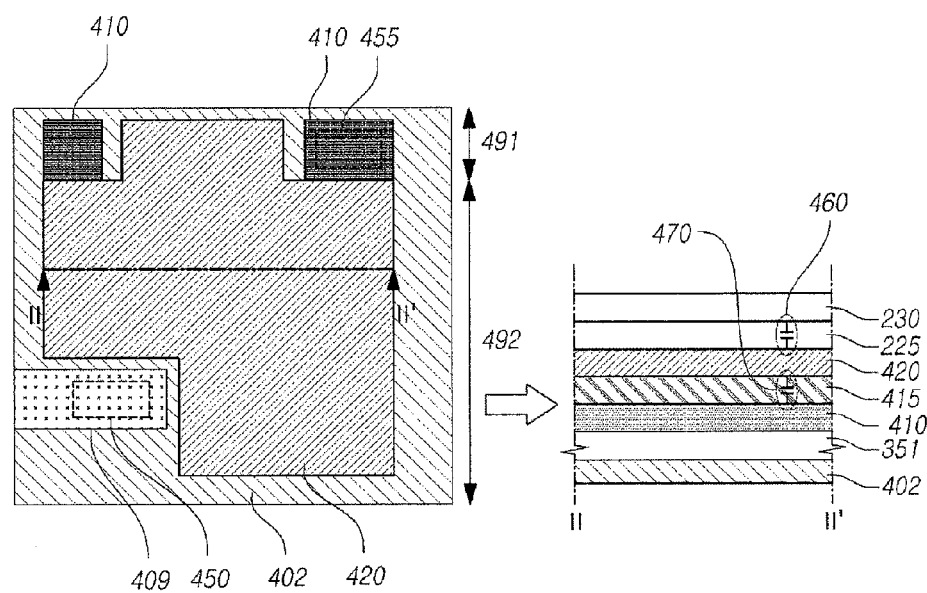
FIG. 4 is a view illustrating a storage capacitor formed in parallel according to an embodiment of the present invention.

FIG. 4 is a view illustrating a storage capacitor formed in parallel according to an embodiment of the present invention. FIG. 4 shows a TFT area 491 and a storage capacitor area 492. In order to form the storage capacitor in parallel, a light shielding layer 402 is connected to an ELVDD (EVDD or VDD) 409 which is a driving power line through a contact hole 450, and thus a power is applied to the light shielding layer 402. Meanwhile, a gate layer 420 is formed with a gate material in the TFT area 491 and the storage capacitor area 492. The gate layer 420 is formed on an active layer 410. Since the gate layer 420 is formed in the storage capacitor area 492, the active layer 410 of the storage capacitor area 492 does not have conductivity in an etching process. The active layer 410 of the TFT area 491 has conductivity, and is connected to the source/drain electrodes 230 through a contact hole 455.

Meanwhile, the active layer 410 is biased by the power applied to the light shielding layer 402, a storage capacitor 470 is formed between the gate layer 420 and the active layer 410 of the storage capacitor area 492. In addition, an interlayer dielectric 225 is formed on the gate layer 420, the source/drain electrodes 230 is formed on the interlayer dielectric 225, and a storage capacitor 460 is formed between the gate layer 420 and the source/drain electrodes 230. Therefore, since the storage capacitors 460 and 470 are formed in parallel, a capacitance is increased, and an opening ratio can be secured although the capacitance is increased.

In order to maintain the capacitance of the storage capacitor and not to increase the size of the storage capacitor which is a reason of a reduction of an opening ratio, the present invention can secure the opening ratio by forming the storage capacitors 460 and 470 in parallel and increasing the capacitance of the storage capacitor. When the light shielding layer 402 is connected to the ELVDD 409, the active layer 410 is operated as the capacitor due to an electric field, the active layer 410, the gate layer 420 and the source/drain electrodes 230 are connected, and thus parallel capacitors can be implemented.

Therefore, the display panel according to an embodiment of the present invention includes the plurality of pixel areas as described with reference to FIG. 1, each of the pixel areas includes the light emitting area and the non-emissive area, and the non-emissive area includes the storage capacitor area and the TFT area. The light shielding layer disposed in the storage capacitor area is electrically connected to the driving power line through the contact hole 450. The light shielding layer may be formed in the TFT area too, and in this case, the light shielding layer of the storage capacitor area and the light shielding layer of the TFT area may form one light shielding layer.

The oxide semiconductor 410 of FIG. 4, which does not have conductivity insulated from the light shielding layer is formed on the light shielding layer. Of course, the oxide semiconductor is formed in the TFT area and the oxide semiconductor in the area 491 has conductivity due to the etching, but the oxide semiconductor in the area 492 does not have conductivity because the oxide semiconductor in the area 492 is not etched due to the gate 420. The gate 420 is disposed on the oxide semiconductor, insulated from the oxide semiconductor through the gate insulating layer, and is formed in the storage capacitor area and the TFT area. The gate 420 is operated as the gate in the area 491, and the gate 420 is operated as the electrode of the storage capacitor in the area 492. The interlayer dielectric 225 is formed on the gate 420, and the source/drain electrodes area formed on the interlayer dielectric 225. In more detail, the source/drain electrodes are formed in the storage capacitor area and the TFT area, and the source/drain electrodes formed in the TFT area are electrically connected to the oxide semiconductor in the TFT area through the contact hole 455.

In the structure of FIG. 4, the gate is deposited in the storage capacitor area 492 to form the capacitors in parallel, thereby reducing the non-emissive area and increasing the capacitance. In addition, since the gate is deposited in the storage capacitor area in the same manner as the deposition of the gate in the TFT area in a panel forming, the capacitors are formed in parallel without separate and additional processes, thereby increasing the opening ratio and the capacitance.

Figure 5:
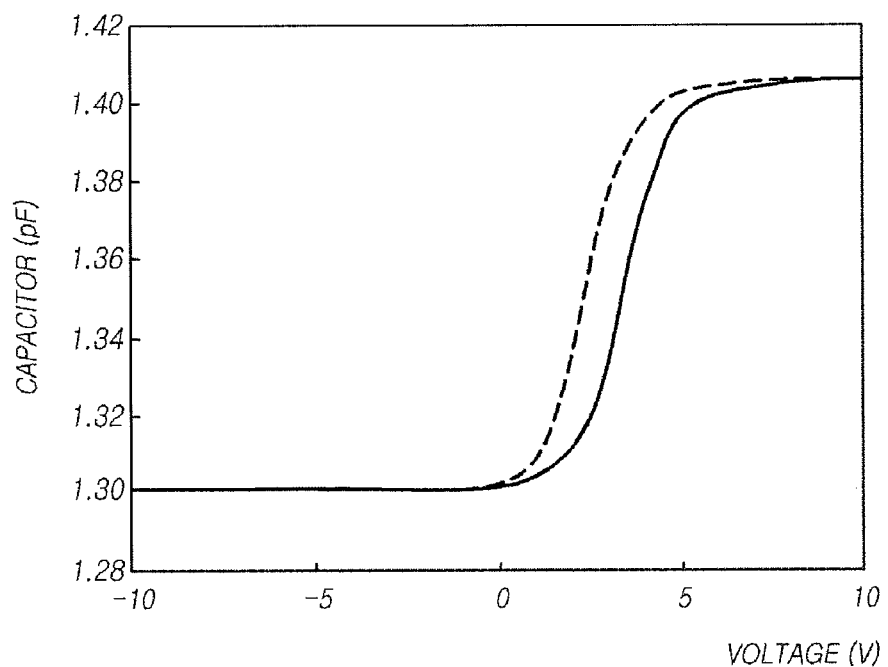
FIG. 5 is a graph which shows that an oxide semiconductor layer (active layer) is operated as a storage capacitor when the oxide semiconductor layer (active layer) is biased according to an embodiment of the present invention.

FIG. 5 is a graph which shows that the oxide semiconductor layer (active layer) is operated as the storage capacitor when the oxide semiconductor layer (active layer) is biased. When the voltage (V) applied to the light shielding layer is increased, the oxide semiconductor layer 410 is biased, and the capacitance (pF) is increased, and thus the oxide semiconductor layer 410 may be used as the electrode of the capacitor. That is, referring to FIGS. 4 and 5, when the voltage (V) applied to the light shielding layer is increased, the insulated oxide semiconductor 410 is biased, and thus the storage capacitor 470 is formed between the gate layer 420 and the oxide semiconductor 410.

Additionally, The storage capacitor 460 is formed between the source/drain electrodes 230 and the gate 420. Therefore, when the present invention is applied, the storage capacitors 460 and 470 are formed in parallel, thereby reducing the area of the capacitor and increasing the capacitance of the storage capacitor.

Figure 6:
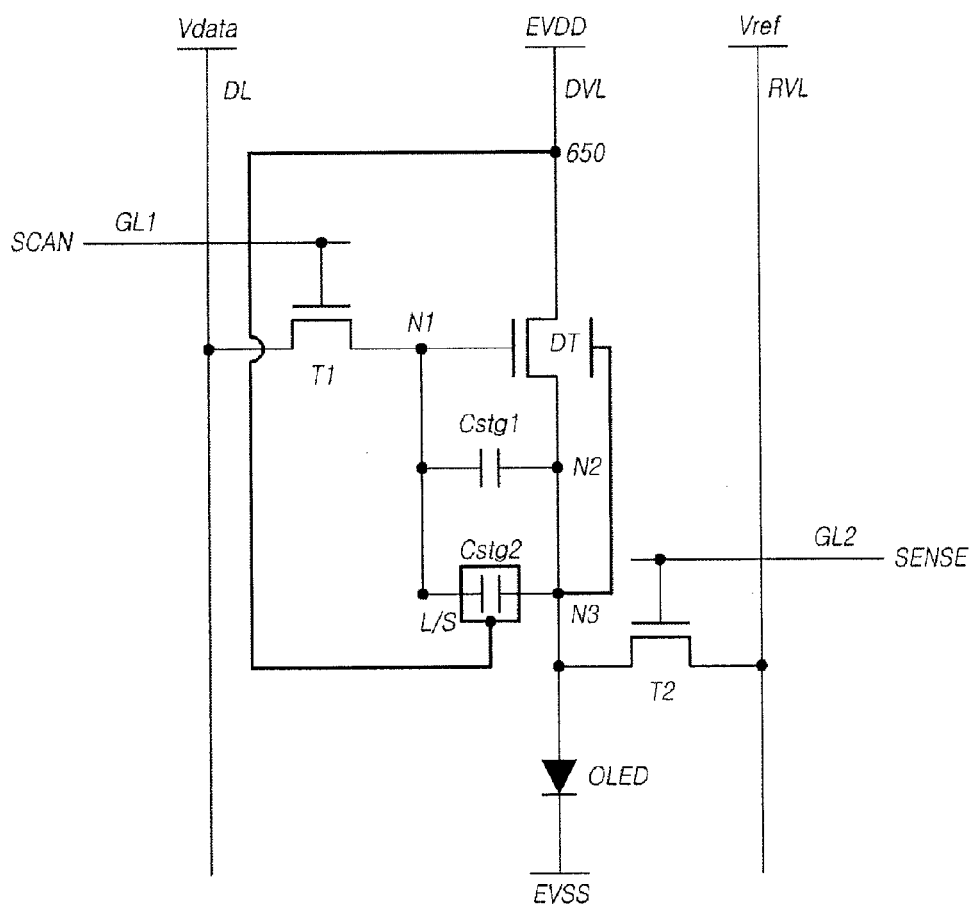
FIGS. 6 and 7 are circuit diagrams illustrating a construction which provides storage capacitors in parallel when a light shielding layer according to an embodiment of the present invention is connected to a driving power line (VDD or EVDD) applying the driving voltage.
Figure 7:
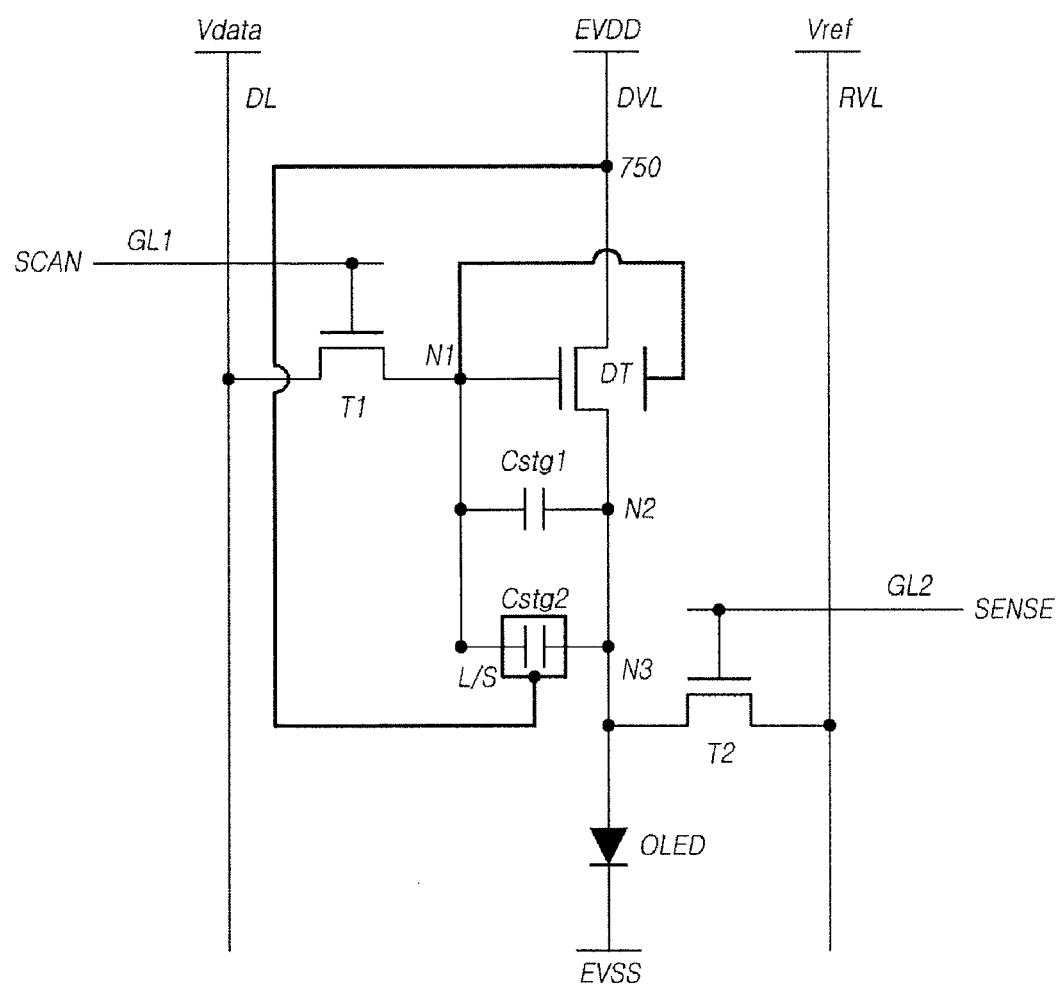

FIGS. 6 and 7 are circuit diagrams illustrating a construction which provides the storage capacitors in parallel when the light shielding layer according to an embodiment of the present invention is connected to the driving power line (VDD or EVDD) applying the driving voltage. In an embodiment of the present invention, the light shielding layer formed in a driving TFT, may be connected to a gate or source/drain electrodes of the driving TFT, and the light shielding layer may be selectively formed in an area corresponding to a switching TFT.

The common elements shown in FIGS. 6 and 7 are described below.

FIGS. 6 and 7 are equivalent circuit diagrams for a pixel structure of each pixel P formed in the display panel 110, when the display device 100 according to embodiments of the present invention is an organic light emitting display device.

When the display device 100 is the organic light emitting display device, each pixel P formed in the display panel 110, for example, may be a 3T(Transistors)1C(Capacitors) structure which includes three transistors DT, T1 and T2 and one storage capacitor Cstg in addition to an Organic Light Emitting Diode (OLED).

Each of the pixels P includes the OLED, a driving transistor DT receiving a driving voltage EVDD through a driving voltage line DVL and connected between the driving voltage line DVL and the OLED, a first transistor T1 controlled by a first scan signal SCAN provided through a first gate line GLI and connected between a data line providing a data voltage Vdata and a first node (i.e., gate node) N1 of the driving transistor DT, a second transistor T2 controlled by a second scan signal SENSE provided through a second gate line GL2 and connected between a node to which a reference voltage Vref is provided through a reference voltage line RVL and a second node (e.g., source node or drain node) N2 of the driving transistor DT, and a first storage capacitor Cstg1 connected between the first node N1 of the driving transistor DT and the second node N2 of the driving transistor DT.

The first transistor T1 turns on or off by the first scan signal SCAN, and applies the data voltage Vdata provided through the data line DL to the gate node N1 of the driving transistor DT driving the OLED.

That is, the first transistor T1 switches the voltage applied to the gate node N1 of the driving transistor DT, and is a switching transistor controlling the driving transistor DT.

In addition, the second transistor T2 is a transistor which applies the reference voltage (i.e., static voltage) Vref necessary in a display driving and a sensing driving, to the second node N2 of the driving transistor DT.

In addition, the second transistor T2 turns on during a predetermined time of a sensing mode period, and enables the voltage of the second node (e.g., source node or drain node) N2 of the driving transistor DT to be sensed through the reference voltage line RVL.

In this process, when a touch occurs in a corresponding pixel, a characteristic of the driving transistor DT is changed, and the second transistor T2 senses the change.

Here, the reference voltage line RVL is a line to which the reference voltage Vref is provided and a line at which the voltage of the second node (e.g., source node or drain node) N2 of the driving transistor DT is sensed.

In both of FIGS. 6 and 7, a light shielding layer is connected to the EVDD to form a second storage capacitor Cstg2.

Referring to FIG. 6 firstly, the first storage capacitor Cstg1 corresponds to the reference numeral 460 of FIG. 4, and the second storage capacitor Cstg2 corresponds to the reference numeral 470 of FIG. 4. The second storage capacitor Cstg2 which is an embodiment of the present invention is connected to the EVDD at a reference numeral 650, and the reference numeral 650 means the contact hole 450 of FIG. 4. Meanwhile, the light shielding layer is connected to source/drain electrodes of the driving transistor at a node N3.

In FIG. 7, the first storage capacitor Cstg1 corresponds to the reference numeral 460 of FIG. 4, and the second storage capacitor Cstg2 corresponds to the reference numeral 470 of FIG. 4. The second storage capacitor Cstg2 which is an embodiment of the present invention is connected to the EVDD at a reference numeral 750, and the reference numeral 750 means the contact hole 450 of FIG. 4. In FIG. 7, the light shielding layer is connected to a gate of the driving transistor at the node N1.

When the present invention is applied, since the storage capacitors are provided in parallel, the capacitance of the storage capacitor is maintained in a pixel area, and the area of the storage capacitor is reduced, and thus the opening ratio can be increased. In the prior art, the storage capacitor occupies 25% of space, when the storage capacitors are implemented in parallel, and since the area of the storage capacitor is decreased to ½ with the same capacitance, the space occupied by the storage capacitor is 12.5%. Therefore, about 10% of opening ratio can be improved. In addition, since the opening ratio is increased, a lifetime of an organic light emitting element can be increased.

FIGS. 8A to 8F are views illustrating a process of forming a driving transistor and a storage capacitor according to an embodiment of the present invention.

Figure 8A:
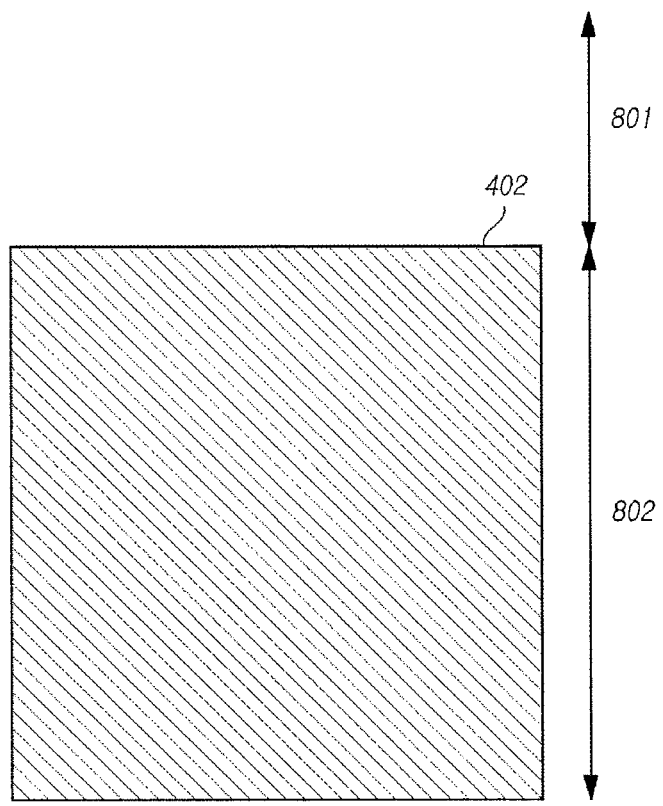
FIGS. 8A to 8F are views illustrating a process of forming a driving transistor and a storage capacitor according to an embodiment of the present invention.

FIG. 8A is a view which shows that a light shielding layer 402 is formed on a substrate. When an area in which the driving transistor is formed is referred to as a TFT area 801 and an area in which the capacitor is formed is referred to as a storage capacitor area 802, the light shielding layer is formed in the storage capacitor area 802. Of course, according to another embodiment, the light shielding layer may be formed in the TFT area 801. In this case, the light shielding layer of the TFT area 801 and the light shielding layer of the storage capacitor area 802 may be separately or connectedly formed.

Figure 8B:
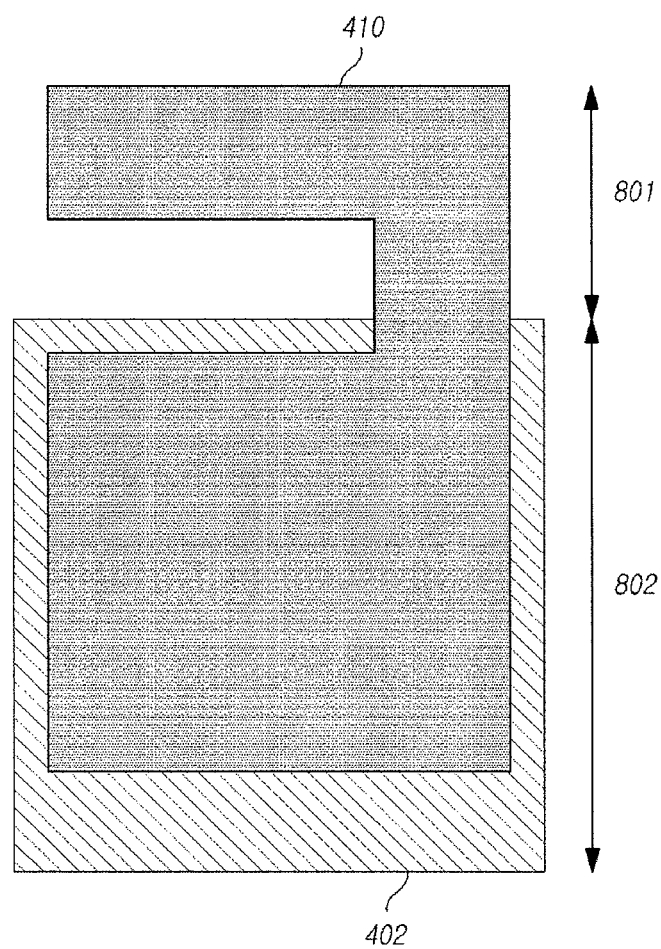

FIG. 8B is a view illustrating the oxide semiconducor layer formed on the light shielding layer. A buffer layer (not shown) is formed on the light shielding layer 402, and the oxide semiconductor layer 410 which is the active layer is formed on the buffer layer. The oxide semiconductor layer 410 is continuously formed in the TFT area 801 and the storage capacitor area 802.

Figure 8C:
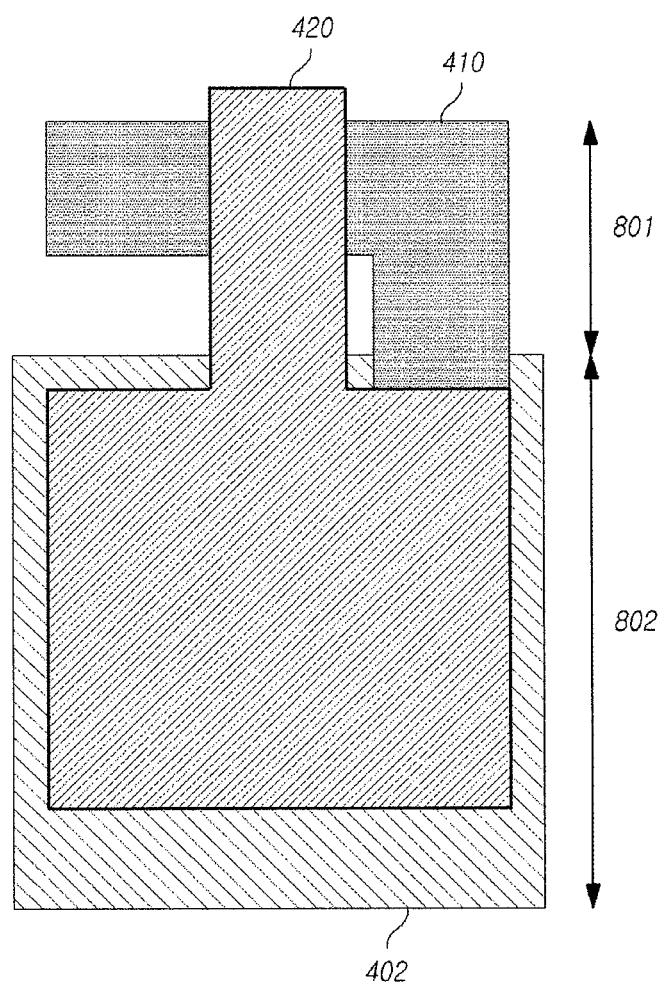

FIG. 8C is a view which shows that the gate layer is formed on the oxide semiconductor layer. According to an embodiment of the present invention, one gate layer is continuously formed in the TFT area 801 and the storage capacitor area 802. The gate layer formed in the TFT area 801 is operated as the gate of the driving transistor, and the gate layer formed in the storage capacitor area 802 is operated as the electrode of the storage capacitor.

Figure 8D:
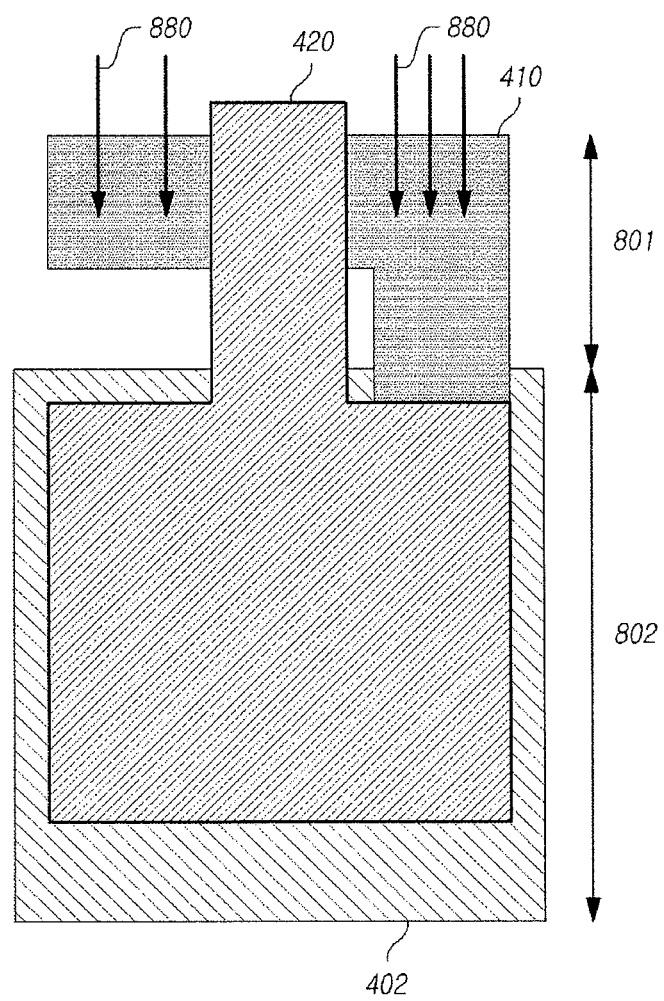

FIG. 8D illustrates a result of the etching. As a result of the etching as shown by a reference numeral 88, a portion which is not coverted by the gate in the oxide semiconductor formed in the TFT area 801 has conductivity. Meanwhile, the oxide semiconductor formed in the storage capacitor area 802 is coverted by the gate, and thus the oxide semiconductor coverted by the gate does not have conductivity. In a structure of FIG. 8D, a portion of the oxide semiconductor layer formed in the TFT area has conductivity, and thus the portion of the oxide semiconductor layer may be operated as an element of the TFT. In addition, another portion of the oxide semiconductor layer, which is formed in the TFT area, is coverted by the gate and is not etched, does not have conductivity, and may be operated as the element of the TFT.

Figure 8E:
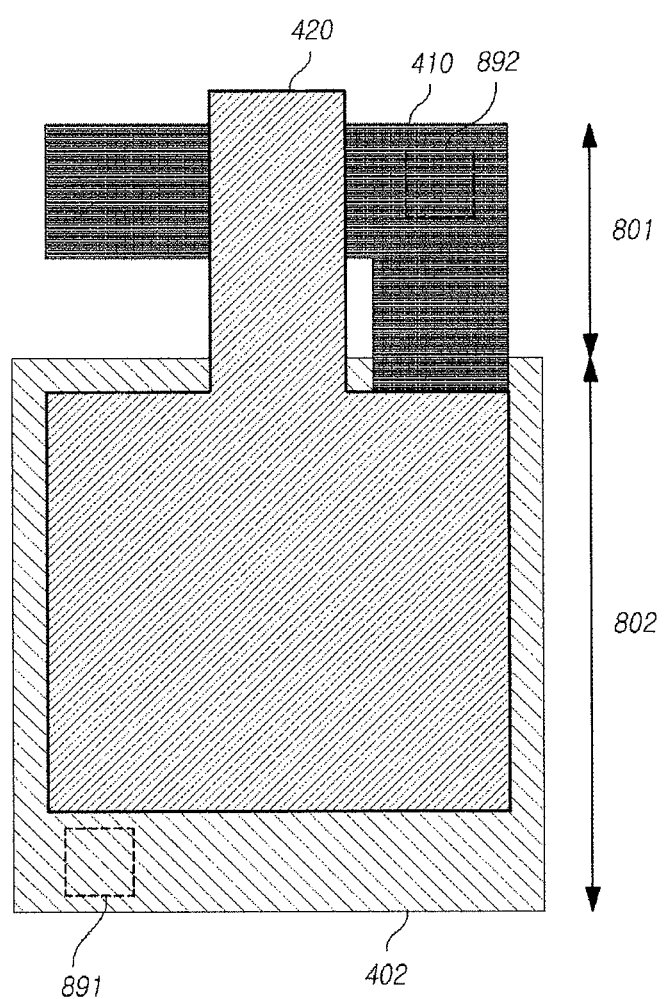

FIG. 8E is a view which shows that an interlayer dielectric is formed and a contact hole is formed. After the interlayer dielectric is formed, a contact hole 891 for connecting the light shielding layer 402 formed in the storage capacitor area 802 with the driving power line is formed, and a contact hole 892 for connecting the oxide semiconductor formed in the TFT area 801 with source/drain electrodes is formed. The contact hole 891 on the light shielding layer according to another embodiment may be firstly etched after the buffer layer is formed.

Figure 8F:
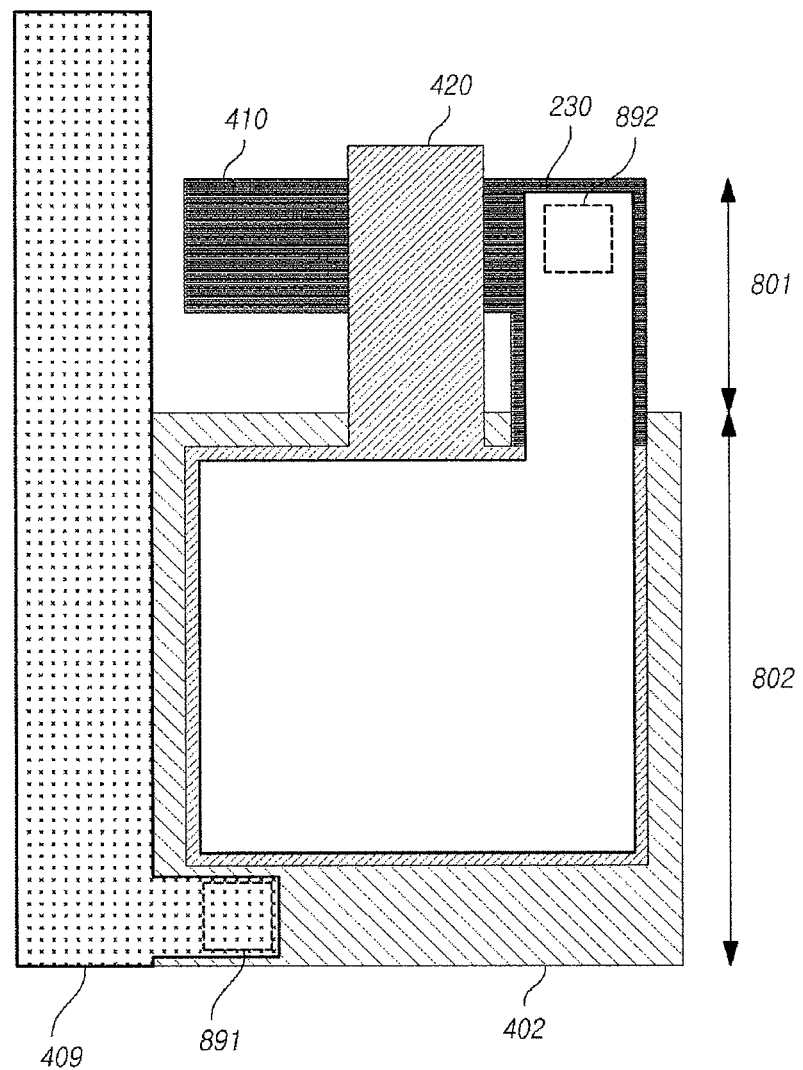

FIG. 8F is a view which shows that the source/drain electrodes and the driving power line are formed simultaneously. According to an embodiment of the present invention, the source/drain electrodes and the driving power line may be formed with the same material. That is, the material forming the source/drain electrodes may form the driving power line. However, in FIG. 8F, in order to distinguish the source/drain electrodes and the driving power line, the source/drain electrodes and the driving power line are shown in different patterns, respectively. The driving power line 409 is electrically connected to the light shielding layer through the contact hole 891. The source/drain electrodes 230 is electrically connected to the oxide semiconductor layer through the contact hole 892. Next, when a voltage is applied to the driving power line 409, the voltage is applied to the light shielding layer 402, and thus the storage capacitor is formed between the gate 420 and the biased oxide semiconductor 410 of the storage capacitor area 802. In the same manner, the storage capacitor is formed between the gate 420 and the source/drain electrodes 230 of the storage capacitor area 802. Since the storage capacitors are formed in parallel, the capacitance is increased, and the area of the storage capacitor is reduced with respect to the same capacitance. Therefore, when the present invention is applied, the same capacitance may be provided in a storage capacitor area which is smaller than that of the storage capacitor area shown in FIG. 3A, and thus an opening ratio can be increased.

Referring to FIGS. 8A to 8F, as shown in FIG. 4, in the storage capacitor areas 802 and 492, the oxide semiconductor 410, the gate 420 and the source/drain electrodes 230 overlap, and the storage capacitors 460 and 470 are formed in parallel. Here, the oxide semiconductor 410 is not etched by the gate 420, and when a power is applied to the light shielding layer 402 connected to the driving power line, the oxide semiconductor 410 is operated as the storage capacitor together with the gate 420. In addition, since the gate 420 and the source/drain electrodes 230 are also operated as the storage capacitor, two storage capacitors are formed in parallel, and the capacitance is increased, and thus the area of the storage capacitor can be reduced.

Figure 9:
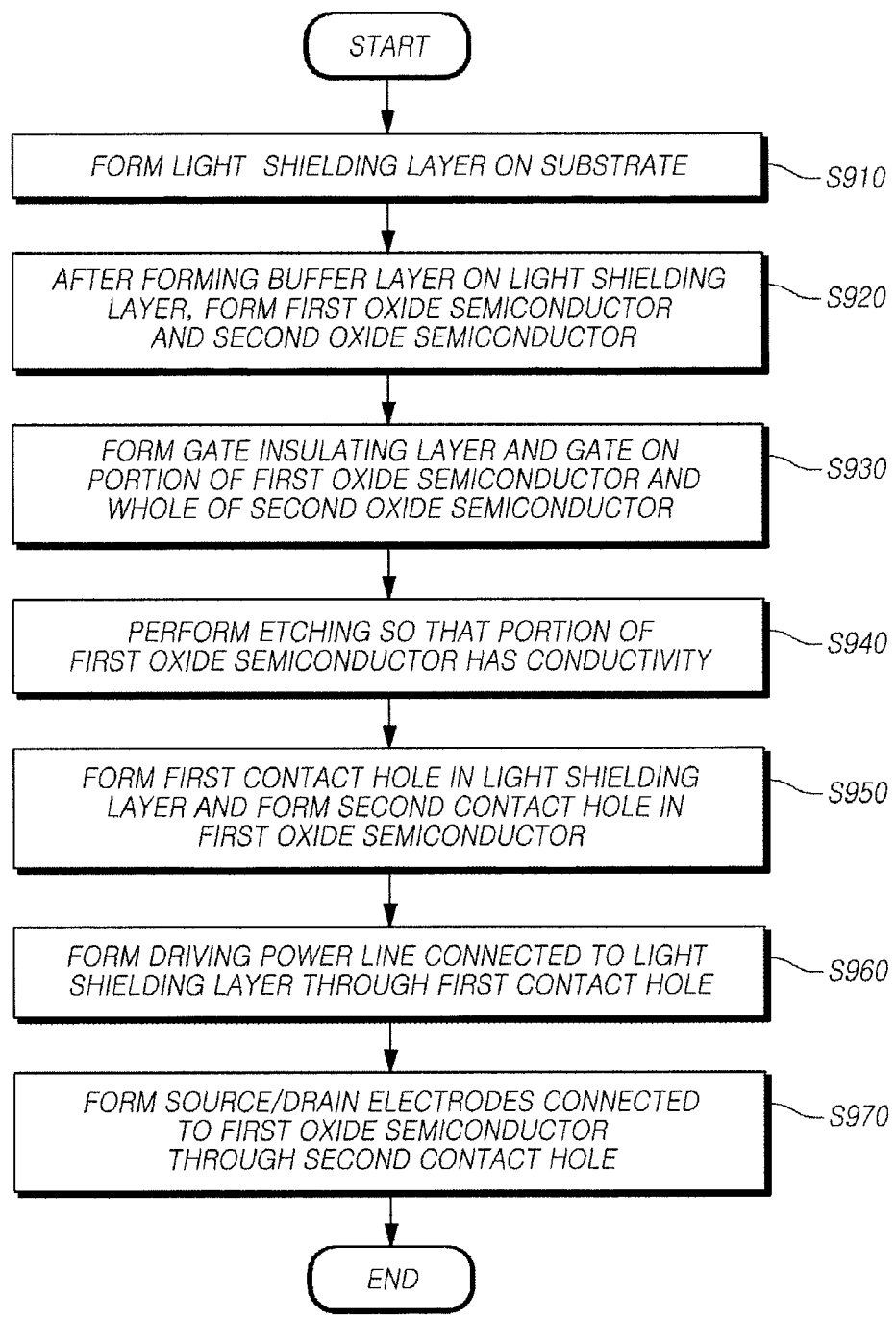
FIG. 9 is a view illustrating a method of manufacturing a display panel according to an embodiment of the present invention.

FIG. 9 is a view illustrating a method of manufacturing a display panel according to an embodiment of the present invention. FIG. 9 shows a process of forming one TFT and a capacitor driving one pixel area.

A light shielding layer is formed on a substrate (S910). The light shielding layer is the same as that of FIG. 8A. The light shielding layer may be formed in both of the TFT area and the storage capacitor area, or may be formed in only the capacitor area, in consideration of a TFT structure, a characteristic of the substrate, etc.

Next, a buffer layer is formed on the light shielding layer, and a first oxide semiconductor and a second oxide semiconductor are formed (S920). The first oxide semiconductor is formed in the TFT area, the second oxide semiconductor is formed in the storage capacitor area, and the first oxide semiconductor and the second oxide semiconductor are connected. In FIG. 8B, the formed first and second oxide semiconductors are connected as shown in the reference numeral 410. The construction of FIG. 8 enables the first oxide semiconductor to be operated as an element of a TFT and the second oxide semiconductor to be operated as an element of a storage capacitor. The second oxide semiconductor does not have conductivity, and is operated as the capacitor in connection to the gate which is one electrode of parallel storage capacitors.

Next, a gate insulating layer and a gate are formed on a portion of the first oxide semiconductor and a whole of the second oxide semiconductor (S930). The gate overlapping the portion of the first oxide semiconductor is a gate of the TFT, and the gate overlapping the whole of the second oxide semiconductor is one electrode of the storage capacitor. This forms the storage capacitor 470 of FIG. 4. A result of the present step is the same as FIG. 8C. After the gate is formed, an etching is performed to enable the portion of the first oxide semiconductor to have conductivity (S940). An area of the first oxide semiconductor, which does not overlap the gate, has conductivity by the etching. However, since the second oxide semiconductor is covered by a whole of the gate, the second oxide semiconductor is not etched, and thus the second oxide semiconductor does not have conductivity. This is shown in FIG. 8D.

Next, a first contact hole is formed in the light shielding layer, and a second contact hole is formed in the first oxide semiconductor (S950). As shown in FIG. 8E, the first contact hole connects the light shielding layer to the driving power line to enable a driving voltage to be applied to the light shielding layer. The second contact hole connects the first oxide semiconductor with the source/drain electrodes. The driving power line connected to the light shielding layer through the first contact hole is formed (S960). The source/drain electrodes connected to the first oxide semiconductor through the second contact hole is formed (S970). This is the same as shown in FIG. 8F. The driving power line may be formed with the material equal to that of the source/drain electrode, and the driving power line and the source/drain electrodes may be simultaneously formed. This includes an embodiment in which various power and signal lines such as a driving power line, a data line and a base power line are formed in the same process of forming the source/drain electrodes, thereby reducing manufacturing costs and process time by reducing a process.

In step 970, when the source/drain electrodes are formed, the storage capacitor 460 of FIG. 4 may be formed by depositing the material equal to that of the source/drain electrodes. That is, the material of the source/drain electrodes is deposited and formed in the storage capacitor area so that the material of the source/drain electrodes overlaps the gate, and thus the gate and the source/drain electrodes may form the storage capacitor as shown in the reference numeral 802 of FIG. 8F.

As described with reference to FIG. 9, in order to form the storage capacitors in parallel, the gate is deposited on the oxide semiconductor in the storage capacitor area to protect the oxide semiconductor from the etching, and thus the oxide semiconductor does not have conductivity. In addition, the light shielding layer is connected to the driving power line so that the oxide semiconductor is biased. Therefore, the storage capacitors are formed in parallel without increasing the area of the storage capacitors, and thus the capacitance can be increased.

As described above, when the present invention is applied, storage capacitors can be formed in parallel in a TFT using an oxide semiconductor. Specially, the present invention may be applied to a coplanar structure in which a parasitic capacitance is reduced and a current performance is improved, among the TFT structures using the oxide semiconductor. The storage capacitors are formed in parallel, and thus the area of the capacitor is reduced. In addition, a light emitting area in a pixel area is increased, and thus an opening ratio is increased.

The embodiments described in the present specification can be applied to a field using a TFT to which an oxide TFT is applied, and as an embodiment, can be applied to a coplanar structure of a top gate, but they are not limited thereto. Thus, the present invention can be applied so that a light shielding layer in a TFT having the light shielding layer is connected to a driving power line, applies a bias to an active layer through the connection between the light shielding layer and the driving power line, and is used as an electrode of a storage capacitor. In addition, the present invention can be applied in order to use the active layer as the parallel storage capacitors.

While the technical spirit of the present invention has been exemplarily described with reference to the accompanying drawings, it will be understood by a person skilled in the art that the present invention may be varied and modified in various forms without departing from the scope of the present invention. Accordingly, the embodiments disclosed in the present invention are merely to describe, but not limit, the technical spirit of the present invention. Further, the scope of the technical spirit of the present invention is not limited by the embodiments. The scope of the present invention shall be construed on the basis of the accompanying claims in such a manner that all of the technical ideas included within the scope equivalent to the claims belong to the present invention.

What is claimed is:

1. A method of manufacturing a display panel, comprising:
    forming a light shielding layer on a substrate;
    forming a first oxide semiconductor and a second oxide semiconductor on the light shielding layer;
    forming a gate insulating layer and a gate overlapping a portion of the first oxide semiconductor and a whole of the second oxide semiconductor;
    performing an etching so that the portion of the first oxide semiconductor has conductivity;
    forming a first contact hole in the light shielding layer and forming a second contact hole in the first oxide semiconductor;
    forming a driving power line connected to the light shielding layer through the first contact hole; and
    forming source/drain electrodes connected to the first oxide semiconductor through the second contact hole.

2. The method of claim 1, wherein the driving power line and the source/drain electrodes are formed with the same material and formed using one mask.

3. The method of claim 1, wherein the forming the first oxide semiconductor and the second oxide semiconductor comprises:
    forming the first oxide semiconductor in a thin film transistor area;
    forming the second oxide semiconductor in a storage capacitor area; and
    connecting the first oxide semiconductor with the second oxide semiconductor.

4. The method of claim 3, wherein the light shielding layer is formed in a pixel area including the storage capacitor area and the thin film transistor area.

5. The method of claim 3, wherein the second oxide semiconductor formed in the storage capacitor area has not conductivity.

6. The method of claim 1, wherein the first oxide semiconductor and the second oxide semiconductor are formed in a single body.

7. The method of claim 1, wherein the forming the source/drain electrodes comprises forming the source/drain electrodes overlapping the gate in a storage capacitor area.

8. The method of claim 1, further comprises forming a buffer layer on the light shielding layer before forming the first oxide semiconductor and a second oxide semiconductor.

9. The method of claim 1, wherein the second contact hole is formed at an area having conductivity in the first oxide semiconductor.

10. A method of manufacturing a display panel, the display panel including a plurality of pixel areas including a storage capacitor area and a thin film transistor area, comprising:
    forming a light shielding layer in the storage capacitor area;
    forming an oxide semiconductor on the light shielding layer, the oxide semiconductor formed in the storage capacitor area and a thin film transistor area;
    forming a gate insulating layer on the oxide semiconductor and a gate overlapping a portion of the thin film transistor area and a whole of the storage capacitor area;
    forming the portion of the first oxide semiconductor corresponding to the thin film transistor area having conductivity;
    forming a first contact hole in the light shielding layer and forming a second contact hole in the portion of the oxide semiconductor having conductivity;
    forming a driving power line connected to the light shielding layer through the first contact hole; and
    forming source/drain electrodes connected to the oxide semiconductor corresponding to the thin film transistor area through the second contact hole.

11. The method of claim 10, wherein the light shielding layer is formed in the thin film transistor area.

12. The method of claim 10, wherein the oxide semiconductor, the gate and the source/drain electrodes overlap in the storage capacitor area.

13. The method of claim 10, wherein the portion of the first oxide semiconductor having conductivity is formed by a plasma generated in an etching.

14. The method of claim 10, wherein the portion of the oxide semiconductor is not overlapped with the gate.

15. The method of claim 10, wherein a portion of the oxide semiconductor formed in the storage capacitor area has not conductivity.

* * * * *